United States Patent
DePaula et al.

(10) Patent No.: US 7,723,959 B2
(45) Date of Patent: May 25, 2010

(54) METHOD FOR DETERMINING RESIDUAL BATTERY CHARGE

(75) Inventors: Cristiano Borges DePaula, Campinas (BR); Denis Fonseca, Americana (BR)

(73) Assignee: Motorola, Inc., Schaumburg, IL (US)

( * ) Notice: Subject to any disclaimer, the term of this patent is extended or adjusted under 35 U.S.C. 154(b) by 607 days.

(21) Appl. No.: 11/741,348

(22) Filed: Apr. 27, 2007

(65) Prior Publication Data

US 2008/0265840 A1  Oct. 30, 2008

(51) Int. Cl.
  H02J 7/00  (2006.01)
  H02J 7/16  (2006.01)
  G01N 27/416  (2006.01)
(52) U.S. Cl. .......... 320/132; 320/134; 320/136; 320/161; 324/427; 324/432; 324/433
(58) Field of Classification Search .......... 320/132; 324/427
  See application file for complete search history.

(56) References Cited

U.S. PATENT DOCUMENTS

| | | | |
|---|---|---|---|
| 6,222,347 B1 | 4/2001 | Gong | |
| 6,281,683 B1 * | 8/2001 | Podrazhansky et al. | 324/432 |
| 6,307,379 B2 | 10/2001 | Podrazhansky et al. | |
| 6,707,272 B1 | 3/2004 | Thandiwe | |
| 6,789,026 B2 | 9/2004 | Barsoukov et al. | |
| 6,892,148 B2 * | 5/2005 | Barsoukov et al. | 702/63 |
| 7,239,146 B2 * | 7/2007 | James et al. | 324/426 |

* cited by examiner

*Primary Examiner*—Edward Tso
*Assistant Examiner*—Johali A Torres Ruiz
(74) *Attorney, Agent, or Firm*—Gary J. Cunningham

(57) ABSTRACT

A method is provided for determining a residual charge on a battery (12), comprising applying a discharge pulse to the battery (12) and measuring a first voltage on the battery (12) at a first time ($t_1$). Additional voltages on the battery are measured at additional times ($t_2$, $t_3$) subsequent to the first time ($t_1$). Delta voltages ($\Delta V_1$, $\Delta V_2$) are determined by subtracting each of the additional voltages from the first voltage and delta times ($\Delta t_1$, $\Delta t_2$) are determined by subtracting the first time from each of the additional times. Regression equation coefficients ($\alpha$, $\epsilon$) are determined from regression analysis of the delta voltages and delta times, and are applied to a database for determining the residual charge.

22 Claims, 3 Drawing Sheets

METHOD FOR DETERMINING RESIDUAL BATTERY CHARGE

FIELD OF THE INVENTION

The present invention generally relates to batteries and more particularly to a method for determining the residual charge on a battery.

BACKGROUND OF THE INVENTION

Batteries are widely used to provide power, or back-up power, to electronic devices, and especially portable electronic devices including mobile communication devices. While the lifetime of such batteries has improved over the last several years, the demand for battery power has increased as the use of the electronic devices increase due to consumer habits. Extended use of the electronic device may result in a "dead" battery and great frustration to the consumer.

Most consumers find it helpful to have an indication on the electronic device of battery power remaining for use (commonly called residual power). This indication is typically represented by a number or bar graph on a display of the electronic device as a percentage of a fully charged battery.

There are several known methods of determining battery levels. One method determines battery residual charge and battery capacity (total battery capability) by applying discharging pulses and rest periods to a battery, measuring the voltage drop as an index to determine the potential maximum battery capacity. The known art typically uses an open battery voltage to determine the present capacity (residual battery charge).

However, these known methods of estimating the residual battery charge by battery voltage are typically somewhat inaccurate. One disadvantage of these known methods is that the voltage of the battery depends on the current that is drained by the load, with the voltage changing after the load is decreased. For example, the remaining voltage indication increases when a cell phone call is released after use.

Accordingly, it is desirable to provide a method for determining the residual charge on a battery without relying only on battery voltage. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
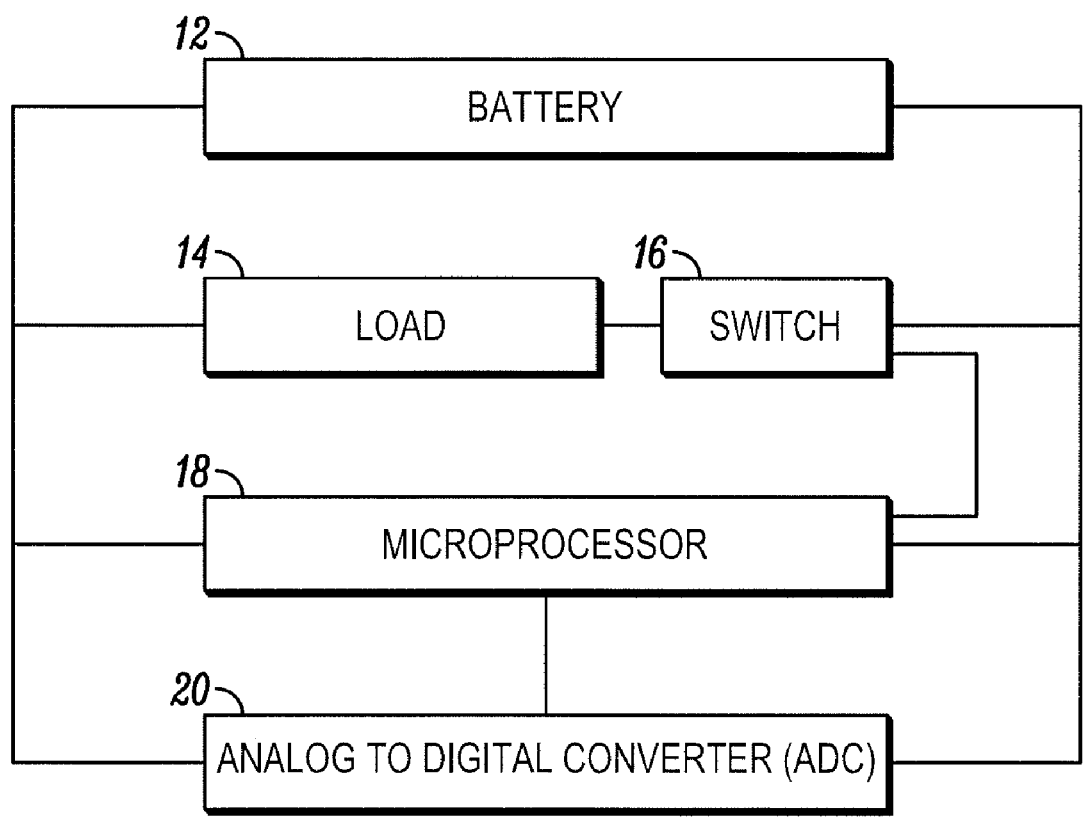
FIG. 1 is a block diagram of an electronic device in accordance with an exemplary embodiment.

Referring to FIG. 1, a block diagram of an electronic device 10 in accordance with an exemplary embodiment includes a battery 12 coupled in parallel with a series connected load 14 and switch 16. The electronic device 10 may be any type of device requiring a battery as the main source of power or as a back-up source of power. One example of the electronic device 10 would be a mobile communication device such as a cell phone. For the exemplary embodiment of a mobile communication device, a Lithium ion battery is preferred; however, the residual power of any type of battery may be determined by the method described herein. While the electronic device 10 may have a minimal battery drain, for example when in a stand-by mode, the load represents a larger current drain, such as when a cell phone call is placed. A microprocessor 18 is coupled to the battery 12 and provides opening and closing instructions to the switch 16. An analog to digital converter 20 is coupled to the battery 12 for measuring the voltage thereacross, and provides voltage magnitudes in digital format to the microprocessor 18.

The method described herein in accordance with the exemplary embodiment measures parameters that describe the timing behavior of the voltage drop due to charge transfer and correlates them to residual (remaining) battery charge. When a current pulse is applied to the battery 12 (application of the load 14), a first voltage drop relating to internal resistance is experienced prior to a second voltage drop relating to battery charge transfer polarization. The current pulse is created when a load is coupled to a battery. The load may be created by turning on or off circuits of the electronic device, e.g., a display or keypad backlight, by answering a call, or by turning on or off a specific load designed just to create the desired current pulse. Internal resistance of the battery is the resistance from anode to cathode in ohms, while the battery charge transfer polarization refers to the transfer of electrons from the anode to the cathode. The speed and magnitude of the voltage drop due to battery charge transfer polarization is related to battery state and to the residual charge of the battery. Regression of voltage drop due to charge transfer is described by the following regression equation for a constant current pulse:

$$\Delta V = (\alpha) \ln(1 + \Delta t/\epsilon)$$

where $\alpha$ is related to the voltage drop, and $\epsilon$ is related to the time of the voltage drop.

Figure 2:
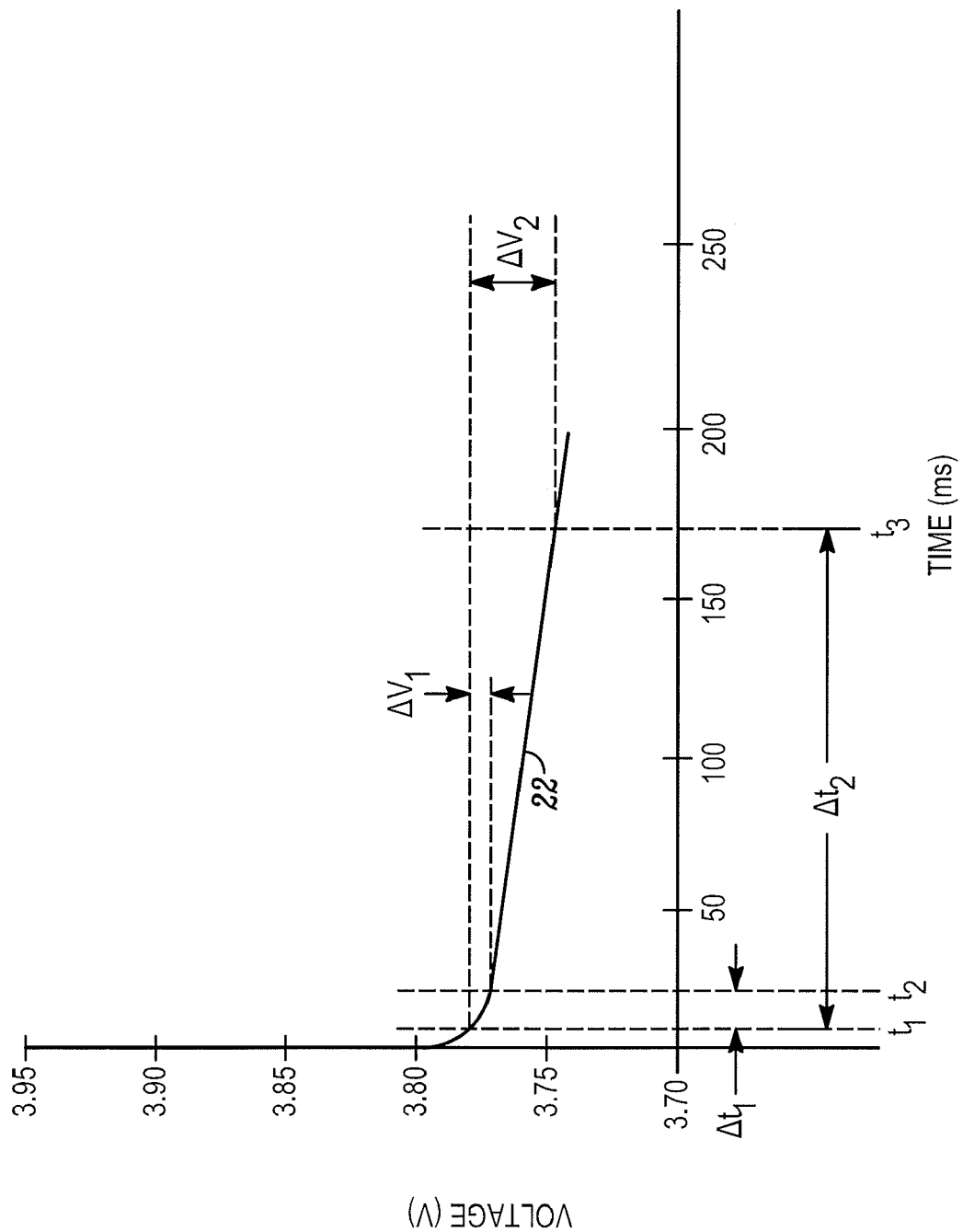
FIG. 2 is a graph of parameters measured from the voltage drop of a battery in accordance with the exemplary embodiment.

The relationship of voltages and times is illustrated in FIG. 2. A graph of voltage (volts) versus time (milliseconds) illustrates the battery voltage 22 as a load is applied. All times and voltages mentioned below are approximate. Furthermore, other voltages, delta voltages, times, and delta times may apply depending on the load and battery type and capacity. Initially, the voltage on the battery is 3.94 volts (at a time before and up to zero milliseconds). A current pulse (the load is coupled to the battery) is applied at a time of zero. A current pulse up to 2.0 amps is foreseeable; however, 1.0 amp is preferred. For lower amperage, more time is required to make the determination of residual power. After a short delay of 10 milliseconds, required to measure the initial voltage of the battery 12 after a voltage drop due to its internal resistance, the voltage is 3.78 volts at $t_1$. At time $t_2$ of 25 milliseconds, the voltage is measured to be 3.77 volts. Time $t_2$ is determined to be 25 milliseconds. At time $t_3$ of 170 milliseconds, the voltage is measured to be 3.74 volts. Time $t_3$ is determined to be 170 milliseconds. Therefore:

$$\Delta t_1 = t_1 - t_d = 25 - 10 = 15 \text{ milliseconds,}$$

$$\Delta t_2 = t_2 - t_d = 170 - 10 = 160 \text{ milliseconds,}$$

$$\Delta V_1 = 3.78 - 3.77 = 0.01 \text{ volts, and}$$

$$\Delta V_2 = 3.78 - 3.74 = 0.04 \text{ volts.}$$

These measured values ($\Delta t_1$, $\Delta t_2$, $\Delta V_1$, $\Delta V_2$) are inserted into a system of two regression equations (as shown above), one for $\Delta t_1$ and $\Delta V_1$ and one for $\Delta t_2$ and $\Delta V_2$, and regression analysis is performed by software in the microprocessor 18 to solve this system of equations to determine coefficients $\alpha$ and $\epsilon$. To solve this non-linear system of equations, a numerical method and/or algorithm implemented in the software in the microprocessor 18 is needed. The software for performing this numerical solving of system of equations is known in the industry and may, for example, comprise that offered by Frontline Systems, Inc. of Incline Village, Nev. These two coefficients ($\alpha$ and $\epsilon$) are then used as indices to a look-up table and/or variables in an equation to obtain the residual battery charge in milliamp hours.

Figure 3:
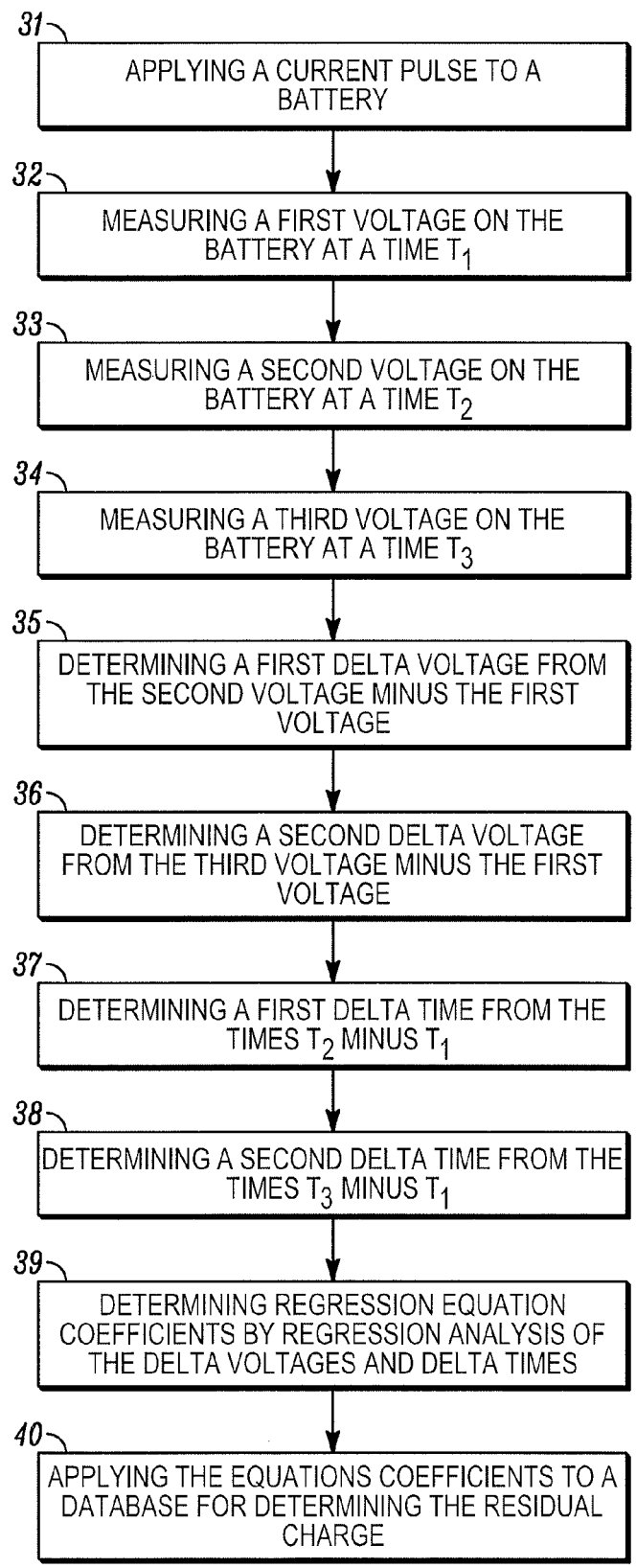
FIG. 3 is flow chart of the steps in accordance with the exemplary embodiment.

Generally, the method for determining a residual charge on a battery comprises applying a discharge pulse to the battery 12 and measuring a first voltage on the battery 12 at a first time $t_1$. Additional voltages on the battery are measured at additional times $t_2$, $t_3$ subsequent to the first time $t_1$. Delta voltages $\Delta V_1$, $\Delta V_2$ are determined by subtracting each of the additional voltages from the first voltage and delta times $\Delta t_1$, $\Delta t_2$ are determined by subtracting the first time from each of the additional times. Regression equation coefficients $\alpha$, $\epsilon$ are determined from regression of the delta voltages and delta times, and are applied to a database for determining the residual charge. More specifically, and as shown in FIG. 3, the method comprises applying 31 a current pulse to a battery, measuring 32 a first voltage on the battery at a time $t_1$, measuring 33 a second voltage on the battery at a time $t_2$, measuring 34 a third voltage on the battery at a time $t_3$, determining 35 a first delta voltage from the second voltage minus the first voltage, determining 36 a second delta voltage from the third voltage minus the first voltage, determining 37 a first delta time from the times $t_2$ minus $t_1$, determining 38 a second delta time from the times $t_3$ minus $t_1$, determining 39 regression equation coefficients by regression analysis of the first and second delta voltage and delta times, applying 40 the equation coefficients to a database for determining the residual charge.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for determining a residual charge on a battery within an electronic device, comprising:
   applying a current pulse to the battery resulting in a voltage at a first time;
   determining first and second delta voltages measured from the voltage, at first and second delta times measured from the first time;
   determining regression equation coefficients from the first and second delta voltages and first and second delta times; and
   applying the regression equation coefficients to a database for determining the residual charge.

2. The method of claim 1 wherein the determination of the regression equation coefficients comprises regression analysis.

3. The method of claim 2 wherein the regression analysis comprises solving a system of two equations $\Delta V_1 = (\alpha)\ln(1+\Delta t_1/\epsilon)$ and $\Delta V_2 = (\alpha)\ln(1+\Delta t_2/\epsilon)$ to determine $\alpha$ and $\epsilon$, where $\alpha$ is related to the voltage drop, $\epsilon$ is related to the time of the voltage drop, $\Delta V_1$ is the first delta voltage, $\Delta V_2$ is the second delta voltage, $\Delta t_1$ is the first delta time, and $\Delta t_2$ is the second delta time.

4. The method of claim 1 wherein the delta voltages and delta times are determined from a delay in time from the first time.

5. The method of claim 1 wherein the first time occurs after the application of the current pulse to allow for a voltage drop due to internal resistance.

6. The method of claim 1 wherein the first time occurs subsequent to the current pulse being applied.

7. The method of claim 1 wherein the electronic device is a mobile communication device and applying a current pulse comprises answering a call.

8. The method of claim 1 wherein the applying a current pulse comprises turning on or off a circuit of the electronic device.

9. A method for determining a residual charge on a battery within an electronic device, comprising:
   connecting a load to the battery;
   measuring a first voltage on the battery at a first time;
   measuring additional voltages on the battery at additional times subsequent to the first time;
   determining delta times by subtracting the first time from each of the additional times;
   determining delta voltages by subtracting each of the additional voltages from the first voltage, wherein each of the delta voltages correspond to one of the delta times;
   determining regression equation coefficients from regression analysis of the delta voltages and delta times; and
   applying the regression equation coefficients to a database for determining the residual charge.

10. The method of claim 9 wherein the regression analysis comprises solving a system of N equations, where N is equal to the number of delta voltages available and is greater or equal to 2, based on the regression equation model $\Delta V = f(\Delta t, a_1, a_2, \ldots, a_N)$, where $\Delta V$ is a function of $\Delta t$ and N coefficients $(a_1, a_2, \ldots, a_N)$, wherein the values for each delta voltage and delta time are respectively substituted for $\Delta V$ and $\Delta t$ in the equation to determine all N coefficients $(a_1, a_2, \ldots, a_N)$.

11. The method of claim 9 wherein the delta voltages and delta times are determined from a delay in time from the first time.

12. The method of claim 9 wherein the first time occurs after the connecting of the load to allow for a voltage drop due to internal resistance.

13. The method of claim 9 wherein the first time occurs after the load is connected.

14. The method of claim 9 wherein the electronic device is a mobile communication device and connecting a load comprises answering a call.

15. The method of claim 9 wherein the connecting a load comprises turning on or off a circuit of the electronic device.

16. A method for determining a residual charge on a battery within an electronic device, comprising:
- connecting a load to the battery;
- measuring a first voltage on the battery at a time $t_1$;
- measuring a second voltage on the battery at a time $t_2$;
- measuring a third voltage on the battery at a time $t_3$;
- determining a first delta voltage from the second voltage minus the first voltage;
- determining a second delta voltage from the third voltage minus the first voltage;
- determining a first delta time from the times $t_2$ minus $t_1$;
- determining a second delta time from the times $t_3$ minus $t_1$;
- determining regression equation coefficients by regression analysis of the first and second delta voltage and first and second times; and
- applying the regression equation coefficients to a database for determining the residual charge.

17. The method of claim 16 wherein the regression analysis comprises solving a system of equations based on the equation $\Delta V=(\alpha)\ln(1+\Delta t/\epsilon)$ wherein the values for each delta voltage and delta time are respectively substituted for $\Delta V$ and $\Delta t$, to determine $\alpha$ and $\epsilon$, where $\alpha$ is related to the voltage drop, and $\epsilon$ is related to the time of the voltage drop.

18. The method of claim 16 wherein the delta voltages and delta times are determined from a delay in time from the first time.

19. The method of claim 16 wherein the time $t_1$ occurs after the load is connected to allow for a voltage drop due to internal resistance.

20. The method of claim 16 wherein the time $t_1$ occurs after the load is connected.

21. The method of claim 16 wherein the electronic device is a mobile communication device and connecting a load comprises answering a call.

22. The method of claim 16 wherein the connecting a load comprises turning on or off a circuit of the electronic device.

* * * * *